United States Patent
Huang

(10) Patent No.: US 7,101,733 B2
(45) Date of Patent: Sep. 5, 2006

(54) LEADFRAME WITH A CHIP PAD FOR TWO-SIDED STACKING AND METHOD FOR MANUFACTURING THE SAME

(75) Inventor: Yao-Ting Huang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 11/135,321

(22) Filed: May 24, 2005

(65) Prior Publication Data

US 2005/0287700 A1  Dec. 29, 2005

(30) Foreign Application Priority Data

Jun. 29, 2004  (TW) .............................. 93119078 A

(51) Int. Cl.
*H01L 21/44* (2006.01)

(52) U.S. Cl. .................................... 438/109

(58) Field of Classification Search ................. 438/15, 438/25, 26, 55, 64, 106, 107, 109, 110, 128; 361/735, 736, 790, 749, 767; 257/686, 737, 257/738, 778

See application file for complete search history.

(56) References Cited

U.S. PATENT DOCUMENTS

| 6,544,812 B1 * | 4/2003 | Camenforte et al. ........ 438/106 |
| 6,872,591 B1 * | 3/2005 | Wang et al. ................. 438/106 |
| 6,908,788 B1 * | 6/2005 | Lin ........................... 438/106 |
| 6,913,949 B1 * | 7/2005 | Pflughaupt et al. ......... 438/109 |

* cited by examiner

*Primary Examiner*—Michael Lebentritt
*Assistant Examiner*—Andre' Stevenson
(74) *Attorney, Agent, or Firm*—Richard E. Fichter

(57) ABSTRACT

A leadframe with a chip pad for two-sided stacking including a chip pad and a plurality of leads is disclosed. A dielectric adhesive layer is formed on the lower surface of the chip pad and is adhered onto a first trace layer, which has a connecting pad. At least a through hole passes through the chip pad, the dielectric adhesive layer and the first trace layer. An electrically-conductive material is formed inside the through hole for electrically connecting the connecting pad of the first trace layer to the chip pad. When an electronic component is mounted on the lower surface of the chip pad, a plurality of bonding wires having one ends on the upper surface of the chip pads can electrically connect the electronic component to the leads for achieving two-sided stacking of the chip pad.

5 Claims, 4 Drawing Sheets

LEADFRAME WITH A CHIP PAD FOR TWO-SIDED STACKING AND METHOD FOR MANUFACTURING THE SAME

This application claims the benefit of Taiwan application Serial No. 93119078, filed Jun. 29, 2004, the subject matter of which is incorporated herein by reference.

BACKGROUND OF THE INVENTION

1. Field of the Invention

The invention relates in general to a leadframe, and more particularly to a leadframe with a chip pad for two-sided stacking and the manufacturing method for the same.

2. Description of the Related Art

Multi-chip package (MCP), a packaging technology attracting more and more attentions recently, integrates several chips of various types or passive pieces into a semiconductor package structure, so that the MCP is more available in functions or higher in capacity. A leadframe with chip pad is a commonly used multi-chip carriage and is conducive to the saving of manufacturing costs. Besides, in order to further reduce package size, a chip or a passive piece is respectively stacked on the upper and the lower surface of the chip pad of the leadframe. However, as the conductive path of the chips inside the package becomes more complicated, it becomes more difficult for the layout of the leads of the leadframe to meet the requirements of the multi-chip.

A multi-chip package structure using the leadframe, "Semi-conductor stacking Package Structure", is disclosed in Taiwanese Patent Publication No. 486151. Referring to FIG. 1, the package structure at least includes a chip pad 10, a plurality of leads 20, an upper chip 30, a lower chip 40 and a molding compound 60. Both the chip pad 10 and the leads 20 are components of a leadframe. The leads 20 are disposed on the periphery of the chip pad 10. The upper chip 30 is attached onto the upper surface 11 of the chip pad 10. The lower chip 40 is attached onto the lower surface 12 of the chip pad 10. The chip pad 10 being a metal material can only provide simple connection for grounding. The electrical connection between the upper chip 30 and the leads 20 is achieved by a plurality of first bonding wires 51 formed through wire-bonding. The first bonding wires 51 are formed by placing the upper surface 11 of the chip pad 10 upwards. The electrical connection between the lower chip 40 and the leads 20 is achieved by a plurality of second bonding wires 52 formed through wire-bonding. The second bonding wires 52 are formed by placing the lower surface 12 of the chip pad 10 upwards. Then, the molding compound 60 is used to encapsulate the upper chip 30, the lower chip 40, the first bonding wires 51 and the second bonding wires 52, so the wire-bonding step is made even more difficult. Moreover, the number of the chips packed inside a molding compound is limited, the layout of trace can not be too complicated due to the leadframe and bonding wire, neither can a passive piece nor other surface mounting electronic component be integrated into the upper and the lower surface of the chip pad.

SUMMARY OF THE INVENTION

It is therefore a main object of the invention to provide a leadframe with a chip pad for two-sided stacking. The leadframe includes a chip pad and a plurality of leads. A dielectric adhesive layer is used to fix a first trace layer onto the lower surface of the chip pad. At least a through hole passes through the chip pad, the dielectric adhesive layer and the first trace layer. An electrically-conductive material is formed inside the through hole, so that the connecting pad of the first trace layer is electrically connected to the chip pad. The electronic component mounted on the lower surface of the chip pad can be electrically connected to the chip pad for the bonding wire to connect the upper surface of the chip pad to the leads for achieving two-sided stacking of the chip pad. The upper and the lower surface of chip pad are effectively used and no complexity is added to the manufacturing process of wire-bonding.

It is therefore a second object of the invention to provide a multi-chip package structure of a chip pad for two-sided stacking. The multi-chip package structure includes a chip pad and a plurality of leads both of which are components of a leadframe. A dielectric adhesive layer and a first trace layer are formed on the lower surface of the chip pad. At least a through hole passes through the chip pad, the dielectric adhesive layer and the first trace layer. An electrically-conductive material is formed inside the through hole for the connecting pad of the first trace layer to be electrically connected to the chip pad, and a solder mask is formed on the first trace layer. A surface mounting electronic component or another chip can be mounted on the lower surface of the chip pad to be electrically connected to the connecting pad of the first trace layer, so that the bonding wire on the upper surface of the chip pad electrically connects the connecting pad of the first trace layer to the leads for achieving a multi-chip package which is easy to achieve high-intensity trace and easy to manufacture, and capable of integrating various electronic components under the chip pad.

The leadframe with a chip pad for two-sided stacking according to the invention includes a chip pad, a plurality of leads, a dielectric adhesive layer, a first trace layer, at least a through hole, an electrically-conductive material and a first solder mask. The chip pad has an upper surface and a lower surface. The leads are disposed on the periphery of the chip pad. The dielectric adhesive layer is formed on the lower surface of the chip pad for the first trace layer to be adhered onto the lower surface of the chip pad. The first trace layer has at least a first connecting pad. Preferably, the thickness of the first trace layer is smaller than that of the chip pad. The through hole passes through the chip pad, the dielectric adhesive layer and the first trace layer. The electrically-conductive material is formed inside the through hole for electrically connecting the connecting pad of the first trace layer to the chip pad. The first solder mask can be formed on the first trace layer and expose the first connecting pad of the first trace layer. Preferably, part of the chip pad is etched to form a second trace layer electrically connected to the electrically-conductive material. The second trace layer has at least a second connecting pad and can further include a second solder mask formed on the upper surface of the chip pad to protect the second trace layer. Therefore, the leadframe according to the invention is capable of double-siddedly stacking various chips, passive pieces or surface mounting electronic components on the chip pad, and using the bonding wire formed according to single-sided wire-bonding to electrically connect the leads.

Other objects, features, and advantages of the invention will become apparent from the following detailed description of the preferred but non-limiting embodiments. The following description is made with reference to the accompanying drawings.

DETAILED DESCRIPTION OF THE INVENTION

Referring to the accompanying drawings, the invention is exemplified by the embodiment disclosed below.

Figures 1, 2:
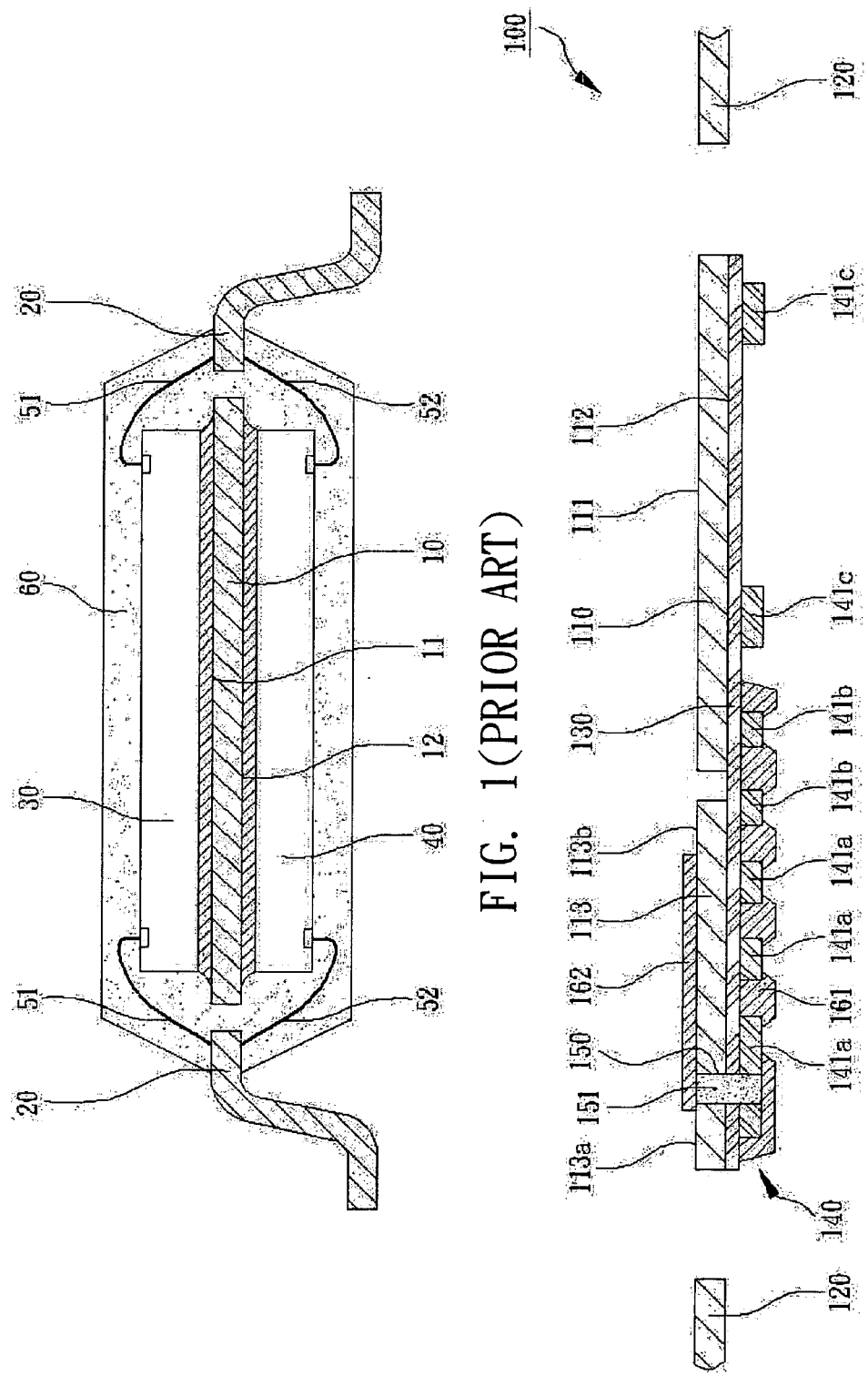
FIG. 1 (Prior Art) is a cross-sectional view of the structure of a conventional two-sided stacking chip pad.
FIG. 2 is a cross-sectional view of a leadframe with a chip pad for two-sided stacking according to an embodiment of the invention.
Figure 3A:
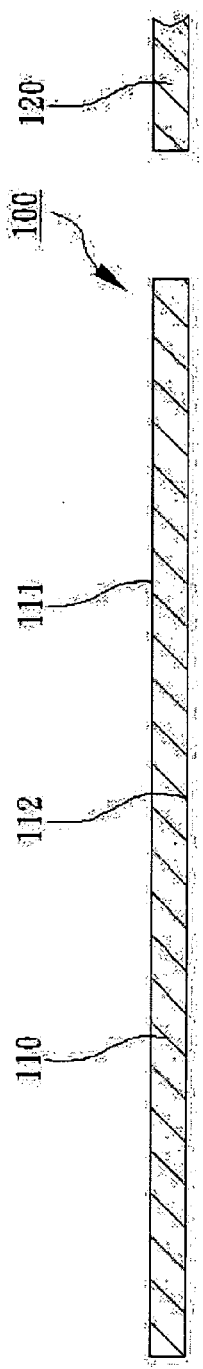
FIGS. 3A~3E are cross-sectional views of the leadframe with a chip pad for two-sided stacking during manufacturing process according to an embodiment of the invention.
Figure 3B:
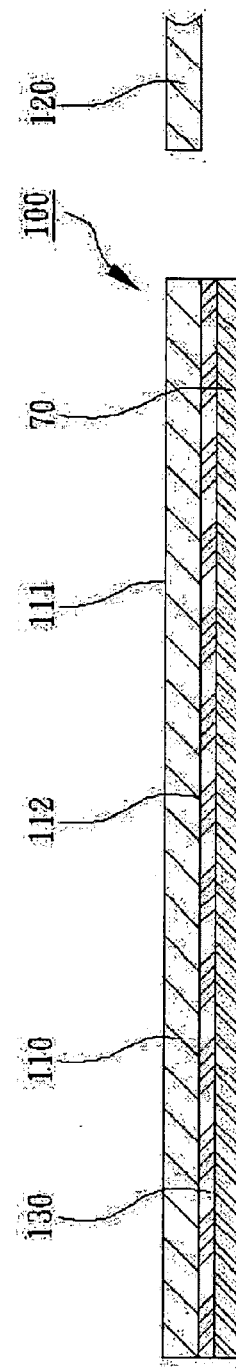
Figure 3C:
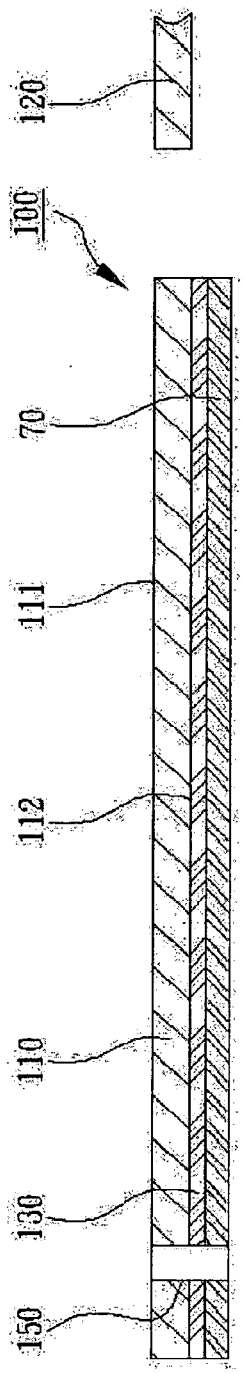
Figure 3D:
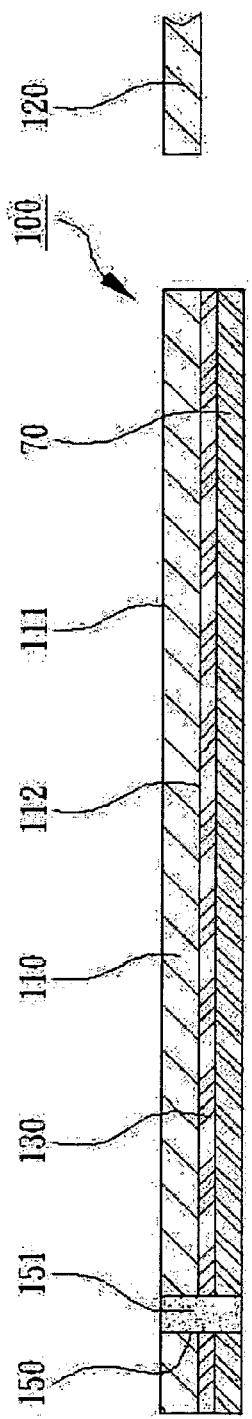
Figure 3E:
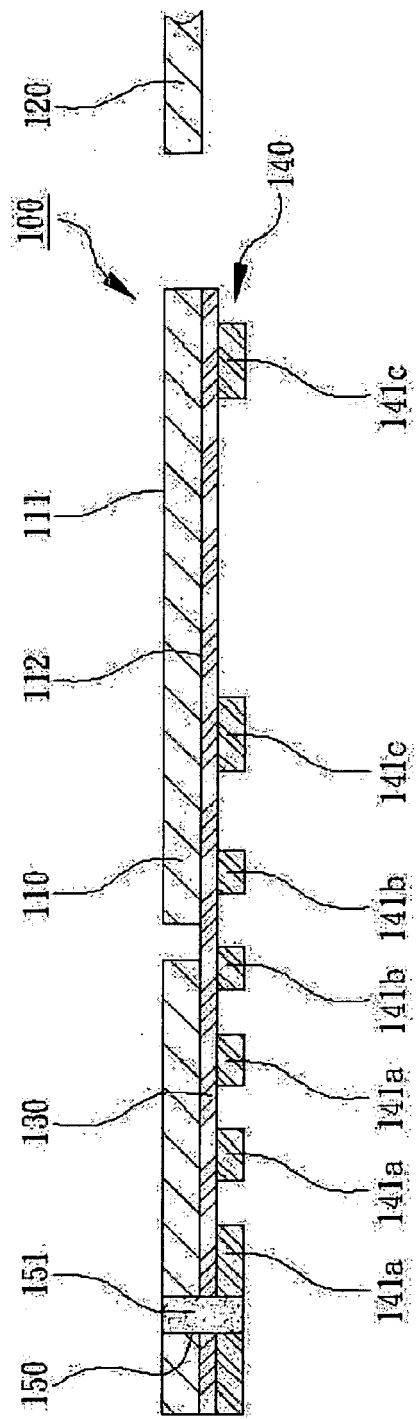

Referring to FIG. 2 a cross-sectional view of a leadframe with a chip pad for two-sided stacking according to an embodiment of the invention is shown. A leadframe with a chip pad for two-sided stacking 100 mainly includes a chip pad 110, a plurality of leads 120, a dielectric adhesive layer 130, a first trace layer 140, at least a through hole 150 and an electrically-conductive material 151. The chip pad 110 and the leads 120 have the same metal material. The chip pad 110 has an upper surface 111 and a lower surface 112. The leads 120 are disposed on 110 the periphery of the chip pad. The dielectric adhesive layer 130 is formed on the lower surface 112 of the chip pad 110 to adhere the first trace layer 140 onto the lower surface 112 of the chip pad 110. The first trace layer 140 is disposed on the dielectric adhesive layer 130 but is not directly electrically connected to the chip pad 110. The first trace layer 140 has a plurality of first connecting pads 141a, 141b, and 141c. Preferably, the thickness of the first trace layer 140 is smaller than that of the chip pad 110.

The through hole 150 passes through the chip pad 110, the dielectric adhesive layer 130 and the first trace layer 140. The electrically-conductive material 151 is formed inside the through hole 150. In the present embodiment, the through hole 150 is filled with a filling material such as a copper plug, solder or the electrically-conductive material 151 of electrically-conductive resin for electrically connecting the first connecting pads 141a, 141b, and 141c of the first trace layer 140 to the chip pad 110.

Besides, a first solder mask 161 can be formed on the first trace layer 140. The first solder mask 161 exposes the first connecting pads 141a, 141b, and 141c of the first trace layer 140. Preferably, part of the chip pad 110 is etched to form a second trace layer 113. The second trace layer 113 is electrically connected to the electrically-conductive material 151 and has a plurality of second connecting pads 113a and 113b. A second solder mask 162 is formed on the upper surface 111 of the chip pad 110 to protect the second trace layer 113. The second solder mask 162 exposes the second connecting pads 113a and 113b. In the present embodiment, the through hole 150 is covered by the first solder mask 161 and the second solder mask 162.

Figure 4:
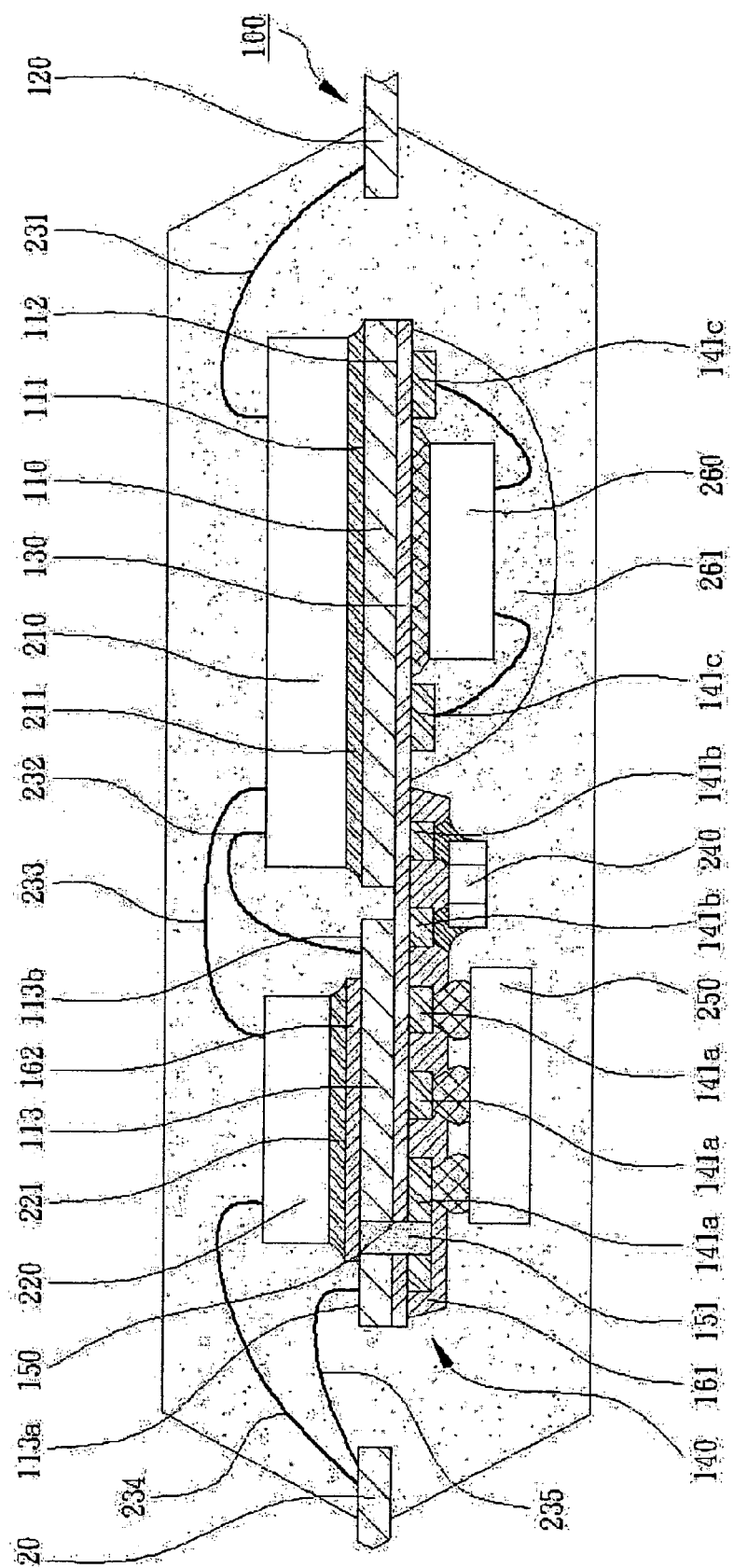
FIG. 4 is a cross-sectional view of the structure using the leadframe with a chip pad for two-sided stacking according to an embodiment of the invention.

Referring to FIG. 4, a cross-sectional view of the multi-chip package structure using the above leadframe 200 is shown. A first chip 210 is attached onto the upper surface 111 of the chip pad 110 using an adhesive 211 or other chip adhesives. A plurality of bonding wires 231 connect the first chip 210 to the leads 120, wherein at least a bonding wire 232 can connect the first chip 210 to a second connecting pad 113a of the second trace layer 113. A second chip 220 is attached onto the second solder mask 162 using an adhesive 221 to prevent the short circuit between the second chip 220 and the second trace layer 113. A plurality of bonding wires 233 are used to connect the second chip 220 to the first chip 210, while a plurality of bonding wires 234 connect the second chip 220 to the leads 120. Before the above steps of die attaching and wire-bonding onto the upper surface 111 of the chip pad 110 to be electrically connected, the components on the lower surface 112 of chip pad 110 should be stacked first. In the present embodiment, a passive piece 240, a surface mounting electronic component 250 or a third chip 260 is mounted on the lower surface 112 of the chip pad 110. The surface mounting electronic component 250 can be a flip chip, a chip scale package (CSP) or a wafer level chip scale package (Wafer Level CSP). The surface mounting electronic component 250 is bonded onto the first connecting pads 141a of the first trace layer 140, and is electrically connected to the second connecting pad 113a of the second trace layer 113 via the electrically-conductive material 151 inside the through hole 150. The passive piece 240 is bonded onto the first connecting pads 141b of the first trace layer 140. The third chip 260 is disposed on the lower surface 112 of the chip pad 110. The third chip 260 can be disposed on the dielectric adhesive layer 130, the first solder mask 161 or the lower surface 112 of the chip pad 110 to be electrically connected to the first connecting pads 141c of part of the first trace layer 140 via the bonding wires. Then, a molding compound 261 is used to encapsulate the third chip 260. Therefore, the passive piece 240, the surface mounting electronic component 250 and various electronic components such as the third chip 260 can be mounted on the lower surface 112 of the chip pad 110 to be electrically connected to the second connecting pad 113a of second trace layer 113 via the electrically-conductive material 151 inside the through hole 150 so that a plurality of bonding wires 235 connect the second connecting pads 113a to their corresponding leads 120. At last, a molding compound 270 is used to encapsulate the first chip 210, the second chip 220, the third chip 260, the surface mounting electronic component 250 and the passive piece 240 to form a multi-chip package structure capable of integrating various chips, surface mounting electronic components and passive pieces on the upper surface 111 and the lower surface 112 of the chip pad 110. Furthermore, a bonding wire formed by single-sided wire-bonding is electrically connected to the leads 120 to improve the applicability of the wire-bonding step after the step of two-sided stacking for the multi-chip.

The manufacturing method of the leadframe 100 is disclosed below. FIGS. 3A to 3E are cross-sectional views of the leadframe 100 during the manufacturing process. Firstly, referring to FIG. 3A, a leadframe 100 is provided. The leadframe 100 includes a chip pad 110 and a plurality of leads 120. Next, referring to FIG. 3B, a dielectric adhesive layer 130 is used to adhere a metal plate 70 onto the lower surface 112 of the chip pad 110. The dielectric adhesive layer 130 has a suitable thickness to electrically isolate the chip pad 110 and the metal plate 70. Next, referring to FIG. 3C, laser or mechanical drilling technology is used to form a through hole 150. The through hole 150 passes through the chip pad 110, the dielectric adhesive layer 130 and the metal plate 70. Next, referring to FIG. 3D, metal plugging, electroplating or printing technology is applied to the through hole 150 to form an electrically-conductive material 151. The electrically-conductive material can be an electrically-conductive filling (such as Silver Epoxy for instance), an electroplating layer or a metal plug to form electrically-conductive through hole which electrically connects the metal plate 70 and the chip pad 110. When the electrically-conductive material 151 is an electroplating layer, non-electrically-conductive or electrically-conductive epoxy (not shown in the diagram) needs to be formed on the wall of the through hole 150. Next, referring to FIG. 3E, technologies of dry film laminating, exposing, developing and etching are used to pattern the metal plate 70 to form a first trace layer 140 having a plurality of first connecting pads 141a, 141b, and 141c. The first connecting pads 141a, 141b, and 141c of the first trace layer 140 are electrically connected to the chip pad 110 via the electrically-conductive material 151. Preferably, the etched chip pad 110 is patterned at the same time to form a second trace layer 113 having a plurality of second connecting pads 113a and 113b. At last, the above first solder mask 161 and second solder mask 162 are respectively formed on the first trace layer 140 and the upper surface 111 of the chip pad 110, hence forming the leadframe with a chip pad for two-sided stacking 100 as shown in FIG. 2.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A manufacturing method of a leadframe with a chip pad for two-sided stacking, comprising:

providing the leadframe comprising the chip pad and a plurality of leads, wherein the chip pad has an upper surface for carrying at least a chip and a lower surface, and the leads are disposed on the periphery of the chip pad;

forming a dielectric adhesive layer on the lower surface of the chip pad, and adhering a metal plate on the dielectric adhesive layer;

forming at least a through hole passing through the chip pad, the dielectric adhesive layer and the metal plate;

forming an electrically-conductive material within the through hole for electrically connecting the metal plate and the chip pad;

patterning the metal plate to form a first trace layer, wherein the first trace layer comprises a first connecting pad electrically connected to the electrically-conductive material;

patterning the chip pad to form a second trace layer, wherein the second trace layer comprises a second connecting pad electrically connected to the electrically-conductive material; and forming a first solder mask on the first trace layer, wherein the first solder mask exposes the first connecting pad of the first trace layer.

2. The manufacturing method according to claim 1, wherein the first trace layer and the second trace layer are patterned at the same time.

3. The manufacturing method according to claim 1, wherein the electrically-conductive material is formed by a metal plugging or an electroplating.

4. The manufacturing method according to claim 1, further comprising forming a second solder mask on the upper surface of the chip pad.

5. The manufacturing method according to claim 1, wherein the step of patterning the metal plate comprises etching.

* * * * *